US007663448B2

(12) United States Patent
Harada et al.

(10) Patent No.: US 7,663,448 B2
(45) Date of Patent: Feb. 16, 2010

(54) LAMINATED BALUN WITH AN INTEGRALLY MOUNTED MATCHING CIRCUIT

(75) Inventors: Nobuhiro Harada, Mine (JP); Atsushi Okabe, Mine (JP); Morito Yasumura, Mine (JP)

(73) Assignee: UBE Industries, Ltd., Yamaguchi (JP)

( * ) Notice: Subject to any disclaimer, the term of this patent is extended or adjusted under 35 U.S.C. 154(b) by 0 days.

(21) Appl. No.: 11/827,056

(22) Filed: Jul. 10, 2007

(65) Prior Publication Data

US 2008/0012780 A1 Jan. 17, 2008

(30) Foreign Application Priority Data

Jul. 14, 2006 (JP) ............................ 2006-194103

(51) Int. Cl.
*H03H 5/00* (2006.01)
*H03H 7/38* (2006.01)

(52) U.S. Cl. .......................... 333/26; 333/33; 333/185; 333/202

(58) Field of Classification Search .................. 333/25, 333/26, 185, 202, 204, 32, 33; 336/200, 336/223, 232
See application file for complete search history.

(56) References Cited

U.S. PATENT DOCUMENTS

| | | | | |
|---|---|---|---|---|
| 6,278,340 | B1 * | 8/2001 | Liu | 333/26 |
| 6,351,192 | B1 * | 2/2002 | Sheen | 333/26 |
| 6,788,164 | B2 * | 9/2004 | Maekawa et al. | 333/26 |
| 6,828,881 | B2 * | 12/2004 | Mizutani et al. | 333/204 |
| 6,850,127 | B2 * | 2/2005 | Sakakura et al. | 333/25 |
| 7,138,884 | B2 * | 11/2006 | Cheung et al. | 333/26 |
| 7,176,768 | B2 * | 2/2007 | Nakamura et al. | 333/25 |
| 7,256,663 | B2 * | 8/2007 | Yasuda et al. | 333/26 |

FOREIGN PATENT DOCUMENTS

| | | |
|---|---|---|
| JP | 2004-304615 | 10/2004 |
| JP | 2004-320561 | 11/2004 |

* cited by examiner

*Primary Examiner*—Robert Pascal
*Assistant Examiner*—Kimberly E Glenn
(74) *Attorney, Agent, or Firm*—Frommer Lawrence & Haug LLP; Ronald R. Santucci

(57) ABSTRACT

A dielectric member comprising a laminated balun and a matching circuit, wherein the matching circuit is integrally mounted within the laminated balun. The matching circuit comprises a patterned conductive film formed on a surface of an existing dielectric substrate in the balun such that the balun is not increased in size.

14 Claims, 6 Drawing Sheets

LAMINATED BALUN WITH AN INTEGRALLY MOUNTED MATCHING CIRCUIT

This application claims priority benefits from Japanese Patent Application No. 2006-194103 filed Jul. 14, 2006, the disclosure of which is hereby incorporated by reference.

BACKGROUND OF THE INVENTION

1. Field of the Invention

The present invention relates to a laminated balun and, more particularly, to a laminated balun including a matching circuit for making an impedance matching between the balun and a circuit or component connected to the balun.

2. Description of the Related Art

A passive component used in a microwave band of several hundreds of MHz to several GHz, such as a filter, is generally configured to treat a signal in an unbalanced mode. On the other hand, an active component such as an amplifier generally operates in a balanced mode. Therefore, in order to connect the passive component and active component to each other, a balance-unbalance transformer (balun) needs to be used to transform an unbalanced signal into a balanced signal or vice versa. As described above, the balun plays an essential role in a communication device. In recent years, with demand for miniaturization, a small-sized laminated balun with less loss is widely used. Similarly, with regard to a filter which plays an essential role in a communication device, a small-sized one with less loss is widely used.

In the case where the passive component operating in an unbalanced mode, such as a filter, is connected to an external circuit such as an amplifier via a balun, a matching circuit is generally interposed between the passive component and external circuit in terms of loss reduction. Conventionally, in the case where a laminated balun is used, a chip-like matching circuit component including an inductor and/or capacitor is prepared as a different component from the balun and is mounted on a substrate together with an external circuit component such as an amplifier IC. However, the configuration as described above increases the area occupied by mounted components, making it difficult to achieve miniaturization of a communication device. Further, the number of components is increased to increase production cost.

In light of the above, as disclosed in, e.g., JP-2004-320561-A (Patent Document 1), there is proposed a structure in which an impedance matching circuit section is incorporated in the laminated balun. Similarly, JP-2004-304615-A (Patent Document 2) proposes a structure in which a matching circuit is incorporated in the laminated balun.

However, in the method disclosed in Patent Document 1, a dielectric layer formed for the purpose of forming a conducting layer constituting the matching circuit is used, so that the number of dielectric layers to be used is increased to increase the thickness of the balun, which is not desirable in terms of miniaturization. Further, in the method disclosed in Patent Document 2, two matching circuits are formed in the same layer so as to make their characteristics identical, so that the circuit configuration is increased in size. Further, a dedicated dielectric layer for forming a conductive layer constituting the matching circuits is additionally provided to increase the thickness of the balun, which is not desirable in terms of miniaturization.

SUMMARY OF THE INVENTION

In view of the above problems in the related art, an object of the present invention is to provide a laminated balun incorporating a matching circuit without increasing the number of dielectric layers to be used, that is, without increasing the thickness of the laminated balun itself.

To achieve the above object, according to the present invention, there is provided a laminated balun comprising:

a dielectric member containing a plurality of laminated dielectric substrates;

a balun section; and a matching circuit section, wherein the dielectric substrates include a first dielectric substrate, second dielectric substrate, third dielectric substrate, and fourth dielectric substrate which are sequentially arranged, the balun section has: a first earth electrode formed on a main surface of the first dielectric substrate; a second earth electrode formed on a main surface of the fourth dielectric substrate; a first transmission line which is formed on a main surface of the second dielectric substrate, one end of which is electrically connected to an unbalanced input/output terminal, and which has first and second portions; and second and third transmission lines on a main surface of the third dielectric substrate, the second transmission line being disposed so as to correspond to the first portion of the first transmission line and having one end thereof electrically connected to a first balanced input/output terminal, the third transmission line being disposed so as to correspond to the second portion of the first transmission line and having one end thereof electrically connected to a second balanced input/output terminal, and the matching circuit section is constituted by a patterned conductive film formed on the main surface of the third dielectric substrate or constituted by both a patterned conductive film formed on the main surface of the third dielectric substrate and the second earth electrode.

In an aspect of the present invention, the matching circuit section is constituted by a conductive line which is the patterned conductive film formed on the main surface of the third dielectric substrate, which extends so as to connect one end of the second transmission line to one end of the third transmission line, and which has an inductance component.

In an aspect of the present invention, the matching circuit section is constituted by: a conductive line which is the patterned conductive film formed on the main surface of the third dielectric substrate, which extends so as to electrically connect one end of the second transmission line to one end of the third transmission line, and which has an inductance component; a first ground capacity electrode for matching circuit section which is the patterned conductive film formed on the main surface of the third dielectric substrate and which is electrically connected to one end of the second transmission line; a second ground capacity electrode for matching circuit section which is the patterned conductive film formed on the main surface of the third dielectric substrate and which is electrically connected to one end of the third transmission line; and the second earth electrode.

In an aspect of the present invention, the plurality of laminated dielectric substrates include the first dielectric substrate, second dielectric substrate, third dielectric substrate, fourth dielectric substrate, and a fifth dielectric substrate which are sequentially arranged, the laminated balun further has a DC power source connection section formed in the dielectric member, and the DC power source connection section has a ground capacity electrode for power source connection section which is a patterned conductive film formed on a main surface of the fifth dielectric substrate, the DC power source connection section electrically connecting the ground capacity electrode for power source connection section to a DC input terminal and electrically connecting the other ends of the second and third transmission lines to the ground capacity electrode for power source connection section. In an aspect of the present invention, the plurality of laminated dielectric substrates include the first dielectric substrate, second dielectric substrate, third dielectric substrate, fourth dielectric substrate, fifth dielectric substrate, and a sixth dielectric substrate which are sequentially arranged, and the DC power connection section further has a third earth electrode formed on a main surface of the sixth dielectric substrate.

To achieve the above object, according to the present invention, there is also provided a laminated balun comprising:

a dielectric member;

a plurality of conductive layers formed in the dielectric member, each of the conductive layers being a patterned conductive film; and a balun section and matching circuit section formed using the patterned conductive film, wherein the plurality of conductive layers include a first conductive layer, second conductive layer, third conductive layer, and fourth conductive layer which are sequentially arranged, the balun section has: a first earth electrode as a patterned conductive film constituting the first conductive layer; a second earth electrode as a patterned conductive film constituting the fourth conductive layer; a first transmission line one end of which is electrically connected to an unbalanced input/output terminal and which has first and second portions and formed as a patterned conductive film constituting the second conductive layer; and second and third transmission lines as a patterned conductive film constituting the third conductive layer, the second transmission line being disposed so as to correspond to the first portion of the first transmission line and having one end thereof electrically connected to a first balanced input/output terminal, the third transmission line being disposed so as to correspond to the second portion of the first transmission line and having one end thereof electrically connected to a second balanced input/output terminal, and the matching circuit section is constituted by a patterned conductive film constituting the third conductive layer or constituted by a patterned conductive film constituting the third conductive layer and second earth electrode.

In an aspect of the present invention, the matching circuit section is constituted by an inductor which is a patterned conductive film constituting the third conductive layer and which extends so as to connect one end of the second transmission line to one end of the third transmission line.

In an aspect of the present invention, the matching circuit section is constituted by: an inductor which is a patterned conductive film constituting the third conductive layer and which extends so as to connect one end of the second transmission line to one end of the third transmission line; a first capacitor constituted by a first ground capacity electrode for matching circuit section which is a patterned conductive film constituting the third conductive layer and which is electrically connected to one end of the second transmission line, and the second earth electrode; a second capacitor constituted by a second ground capacity electrode for matching circuit section which is a patterned conductive film constituting the third conductive layer and which is electrically connected to one end of the third transmission line, and the second earth electrode.

In an aspect of the present invention, the plurality of conductive layers include the first conductive layer, second conductive layer, third conductive layer, fourth conductive layer and a fifth conductive layer which are sequentially arranged, the laminated balun further has a DC power source connection section formed in the dielectric member, and the DC power source connection section has a ground capacity electrode for power source connection section as a patterned conductive film constituting the fifth conductive layer, the DC power source connection section electrically connecting the ground capacity electrode for power source connection section to a DC input terminal and electrically connecting the other ends of the second and third transmission lines to the ground capacity electrode for power source connection section. In an aspect of the present invention, the plurality of conductive layers include the first conductive layer, second conductive layer, third conductive layer, fourth conductive layer, fifth conductive layer, and a sixth conductive layer which are sequentially arranged, and the DC power source connection section further has a third earth electrode formed as a patterned conductive film constituting the sixth conductive layer.

In an aspect of the present invention, the DC input terminal is attached to the outer surface of the dielectric member. In an aspect of the present invention, the unbalanced input/output terminal, first balanced input/output terminal, second balanced input/output terminal, and an earth terminal connected to the first and second earth electrodes are attached to the outer surface of the dielectric member.

According to the present invention, a matching circuit section is constituted by a patterned conductive film constituting the third conductive layer formed on the main surface of the third dielectric substrate or both a patterned conductive film constituting the third conductive layer formed on the main surface of the third dielectric substrate and second earth electrode. As a result, it is possible to provide a laminated balun in which the matching circuit is integrally mounted without increasing the number of dielectric substrates to be used, that is, without increasing the thickness of the laminated balun.

DETAILED DESCRIPTION OF THE PREFERRED EMBODIMENTS

Figure 1:
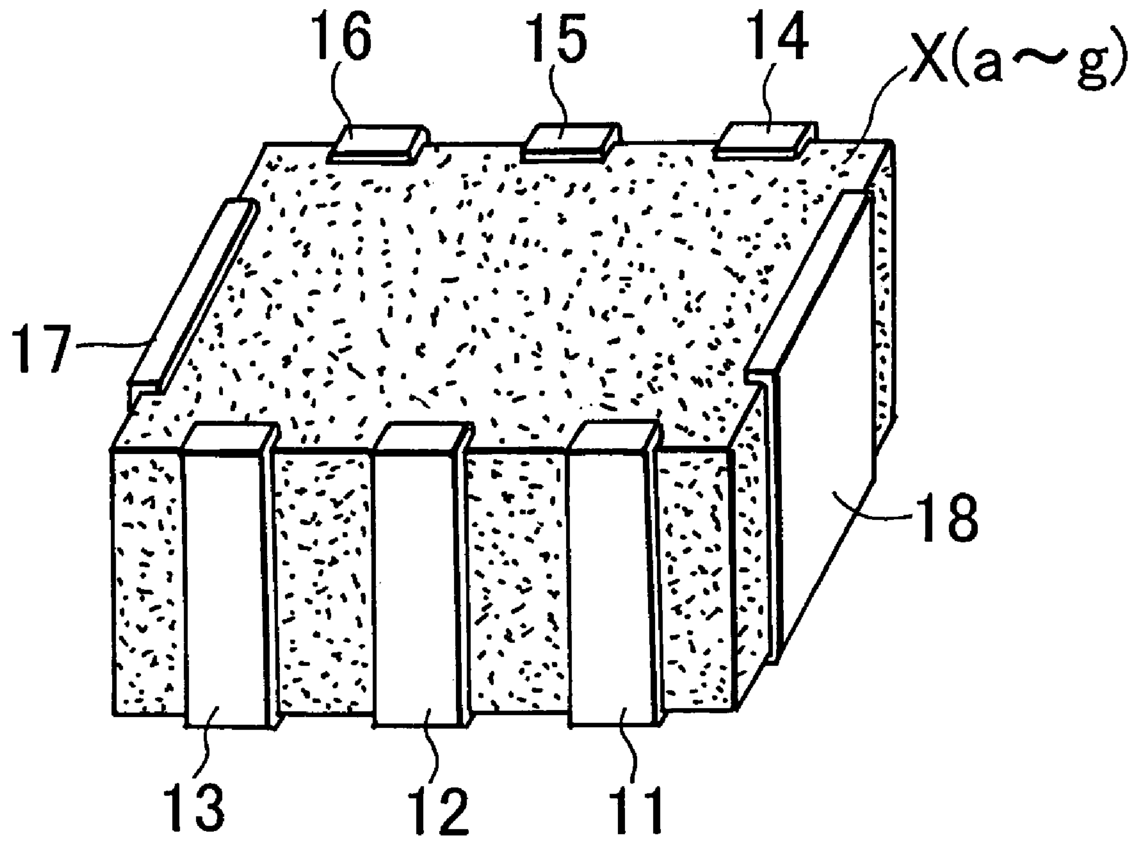
FIG. 1 is a perspective view schematically showing an embodiment of a laminated balun according to the present invention.

Embodiments of the present invention will be described below with reference to the accompanying drawings. In the following description, the same reference numerals denote the same parts through the drawing.

Figure 2:
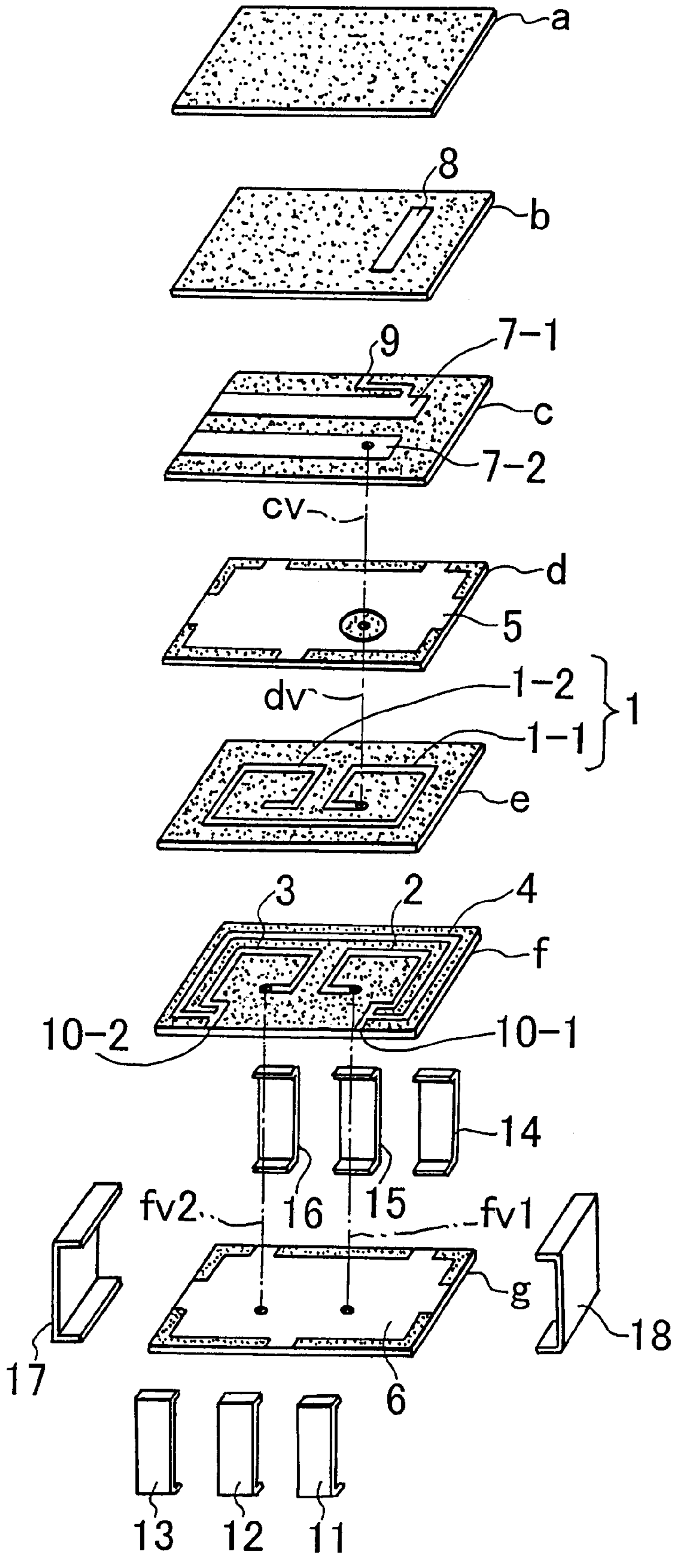
FIG. 2 is an exploded perspective view of the laminated balun of FIG. 1.
Figure 3:
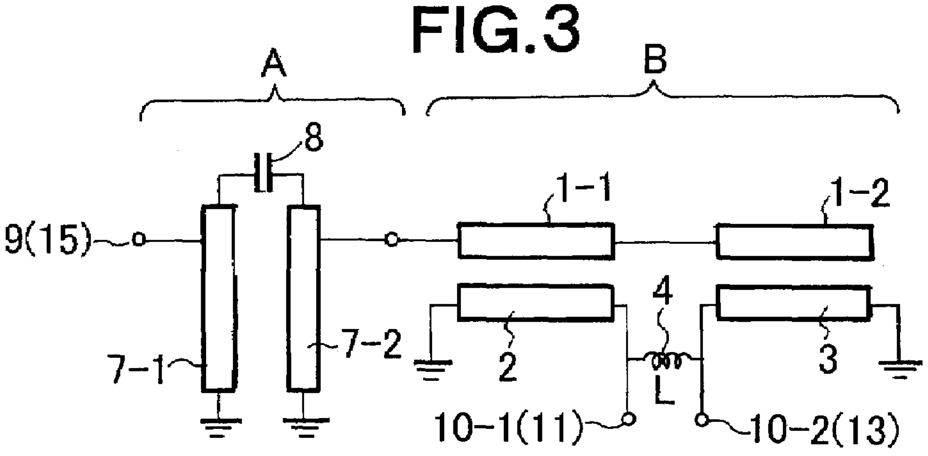
FIG. 3 is an equivalent circuit diagram of the laminated balun of FIG. 1.

FIG. 1 is a perspective view schematically showing an embodiment of a laminated balun according to the present invention, FIG. 2 is an exploded perspective view thereof, and FIG. 3 is an equivalent circuit diagram according to the present embodiment.

The laminated balun according to the present embodiment is constituted by a dielectric member X obtained by laminating a plurality of dielectric substrates (i.e., dielectric layers) a to g in the order mentioned. In the dielectric member X, a balun section and a matching circuit section are formed.

An unbalanced input/output terminal 15, a first balanced input/output terminal 11, a second balanced input/output terminal 13, and earth terminals 12, 14, 16, 17, 18 are attached to the outer surface of the dielectric member X. These terminals are made of, e.g., Ag or other metal. The dielectric substrates a to g are made of, e.g., BaO—$TiO_2$ based dielectric ceramics or other dielectric ceramics. A conductive layer which is a patterned conductive film is formed on each of the upper main surfaces of the dielectric substrates b to g. That is, each conductive layer is disposed between the lower and upper main surfaces of two dielectric substrates adjacent to each other.

A coupling electrode 8 which is a patterned conductive film is formed on the upper main surface of the dielectric substrate b.

Resonance electrodes 7-1, 7-2 which are patterned conductive film are formed on the upper main surface of the dielectric substrate c. The resonance electrodes 7-1, 7-2 are arranged in parallel to each other. One end of each of the resonance electrodes 7-1, 7-2 is connected to the earth terminal 17 and the other end thereof is positioned within the dielectric member X. With this configuration, each of the resonance electrodes 7-1, 7-2 forms a ¼-wavelength microstrip line resonator with one end short-circuited and the other end open-circuited. These resonators are coupled to each other by the coupling electrode 8 and the like to constitute a band-pass filter. A drawing-out electrode 9 for unbalanced input/output which is a patterned conductive film is formed on the upper main surface of the dielectric substrate c. The drawing-out electrode 9 for unbalanced input/output has one end connected to a portion near the open-end of the resonance electrode 7-1 and the other end connected to the unbalanced input/output terminal 15.

A first earth electrode 5 which is a patterned conductive film is formed on the upper main surface of the dielectric substrate d (first dielectric substrate). The first earth electrode 5 is connected to the earth terminals 12, 14, 16, 17, and 18.

A first transmission line 1 which is a patterned conductive film is formed on the upper main surface of the dielectric substrate e (second dielectric substrate). The first transmission line 1 has a length substantially half the wavelength of the center frequency of the band-pass filter and constituted by a first portion 1-1 and second portion 1-2 which have the same length in the extending direction of the first transmission line 1. One end of the first transmission line 1 is connected to a portion near the open-end of the resonance electrode 7-2 through via holes cv and dv formed respectively in the dielectric substrates c and d. An opening pattern for insulation with the via hole dv is formed in the earth electrode 5 on the dielectric substrate d at the position of the via hole dv.

Second and third transmission lines 2 and 3 which are patterned conductive films are formed on the upper main surface of the dielectric substrate f (third dielectric substrate). The second transmission line 2 is formed into a pattern corresponding to the first portion 1-1 of the first transmission line so as to be able to form electromagnetic field coupling with the portion 1-1. The third transmission line 3 is formed into a pattern corresponding to the second portion 1-2 of the first transmission line so as to be able to form electromagnetic field coupling with the second portion 1-2. Each of the second and third transmission lines 2 and 3 has a length substantially ¼ the wavelength of the center frequency of the band-pass filter. One end portion 10-1 of the second transmission line 2 is connected to the first balanced input/output terminal 11. One end portion 10-2 of the third transmission line 3 is connected to the second balanced input/output terminal 13.

Further, a conductive line 4 having a pattern extending outside the second and third transmission lines 2 and 3 is formed on the upper main surface of the dielectric substrate f so as to connect the one end portion 10-1 of the second transmission line 2 to one end portion 10-2 of the third transmission line 3. The conductive line 4 functions as an inductor having an inductance component L.

A second earth electrode 6 which is a patterned conductive film is formed on the upper main surface of the dielectric substrate g (fourth dielectric substrate). The second earth electrode 6 is connected to the earth terminals 12, 14, 16, 17, and 18. The other end of the second transmission line 2 is connected to the earth electrode 6 through a via hole fv1 formed in the dielectric substrate f. The other end of the third transmission line 3 is connected to the earth electrode 6 through a via hole fv2 hole formed in the dielectric substrate f.

In FIG. 3, A denotes a band-pass filter, and B denotes a balun. The existence of the earth electrode 5 prevents interference between the band-pass filter A and balun B. In the balun B, a part corresponding to the conductive line 4 constitutes a matching circuit section. In the present embodiment, the unbalanced input/output terminal 15 of the balun B is electrically connected to one end of the first transmission line 1 via the band-pass filter A. The connection point between the band-pass filter A and balun B can be regarded as an unbalanced input/output terminal of the balun B.

The present embodiment can be considered to be a laminated balun in which a plurality of conductive layers each of which is a patterned conductive film are formed in the dielectric member X and the patterned conductive films are used to form a balun section and matching circuit section. Assuming that a conductive layer between the lower main surface of the dielectric substrate c and upper main surface of the dielectric substrate d is a first conductive layer, a conductive layer between the lower main surface of the dielectric substrate d and upper main surface of the dielectric substrate e is a second conductive layer, a conductive layer between the lower main surface of the dielectric substrate e and upper main surface of the dielectric substrate f is a third conductive layer, a conductive layer between the lower main surface of the dielectric substrate f and upper main surface of the dielectric substrate g is a fourth conductive layer, the following description can be made.

That is, in the balun section, the first earth electrode 5 is formed as a patterned conductive film constituting the first conductive layer. The second earth electrode 6 is formed as a patterned conductive film constituting the fourth conductive layer. The first transmission line 1 one end of which is electrically connected to the unbalanced input/output terminal 15 and which is constituted by the first portion 1-1 and second portion 1-2 is formed as a patterned conductive film constituting the second conductive layer. The second transmission line 2 which is so disposed as to correspond to the first portion 1-1 of the first transmission line 1 and which has one end electrically connected to the first balanced input/output terminal 11 and third transmission line 3 which is so disposed as to correspond to the second portion 1-2 of the first transmission line 1 and which has one end electrically connected to the second balanced input/output terminal 13 are formed as a patterned conductive film constituting the third conductive layer. The matching circuit section is formed by the conductive line (inductor) 4 formed by the patterned conductive film constituting the third conductive layer.

The reason for adopting the above description is as follows. That is, in manufacturing the laminated balun described above, a dielectric ceramic material (dielectric ceramic composition) prepared for forming respective dielectric substrates is shaped into an appropriate size, via holes are formed at required positions, metal-containing paste for forming a patterned conductive film is printed in a required pattern on the main surface of the dielectric substrate, and the resultant dielectric substrates are laminated followed by sintering. Therefore, in the case where the dielectric ceramic materials of adjacently disposed dielectric substrates are equivalent to each other, the boundary between them may become obscure or may completely be disappeared after the sintering. Also in this case, the conductive layer constituted by the patterned conductive film keeps its form and, therefore, it can be considered that the description described above is more adequate.

In the embodiment described above, setting the shape, size, and position of the pattern of the conductive line 4 so as to obtain an appropriate inductance component L allows electrical matching between the balun and balanced input/output external circuit component connected to the balun through the first and second balanced input/output terminals 11 and 13 to be easily established.

In the present embodiment, the second transmission line 2, third transmission line 3, and matching circuit are formed on the main surface of the same dielectric substrate f, i.e., in the same conductive layer. Therefore, it is possible to eliminate the need to provide a dedicated dielectric substrate or dedicated conductive layer for the matching circuit, thereby reducing the thickness of the laminated balun and thus facilitating miniaturization thereof. In addition, the electrical interference between the matching circuit and second and third transmission lines 2 and 3 can be minimized.

In the present embodiment, the band-pass filter positioned in the unbalanced input/output section of the balun is provided in the dielectric member X. In other words, the band-pass filter connected to the unbalanced input/output terminal of the balun is integrated by lamination. However, in the present invention, another unbalanced component such as a low-pass filer or high-pass filter may be connected to the unbalanced input/output terminal. Further, the present invention may adopt a configuration in which the above unbalanced component is not integrated by lamination. The same is applied to the following embodiments.

Figure 5:
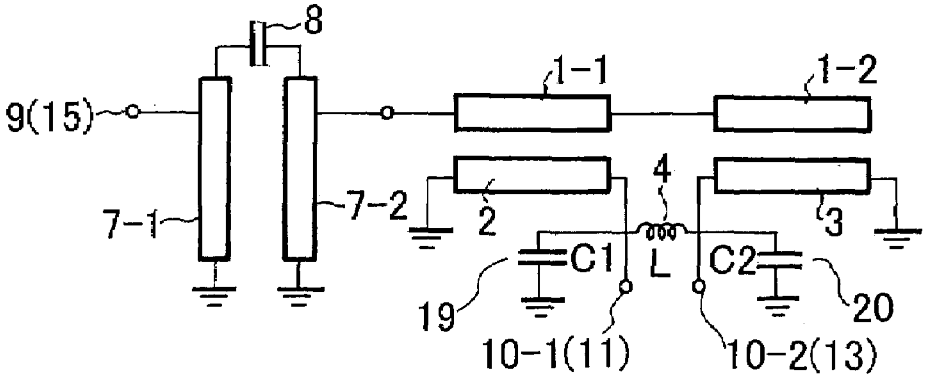
FIG. 5 is an equivalent circuit diagram of the laminated balun of FIG. 4.
Figure 4:
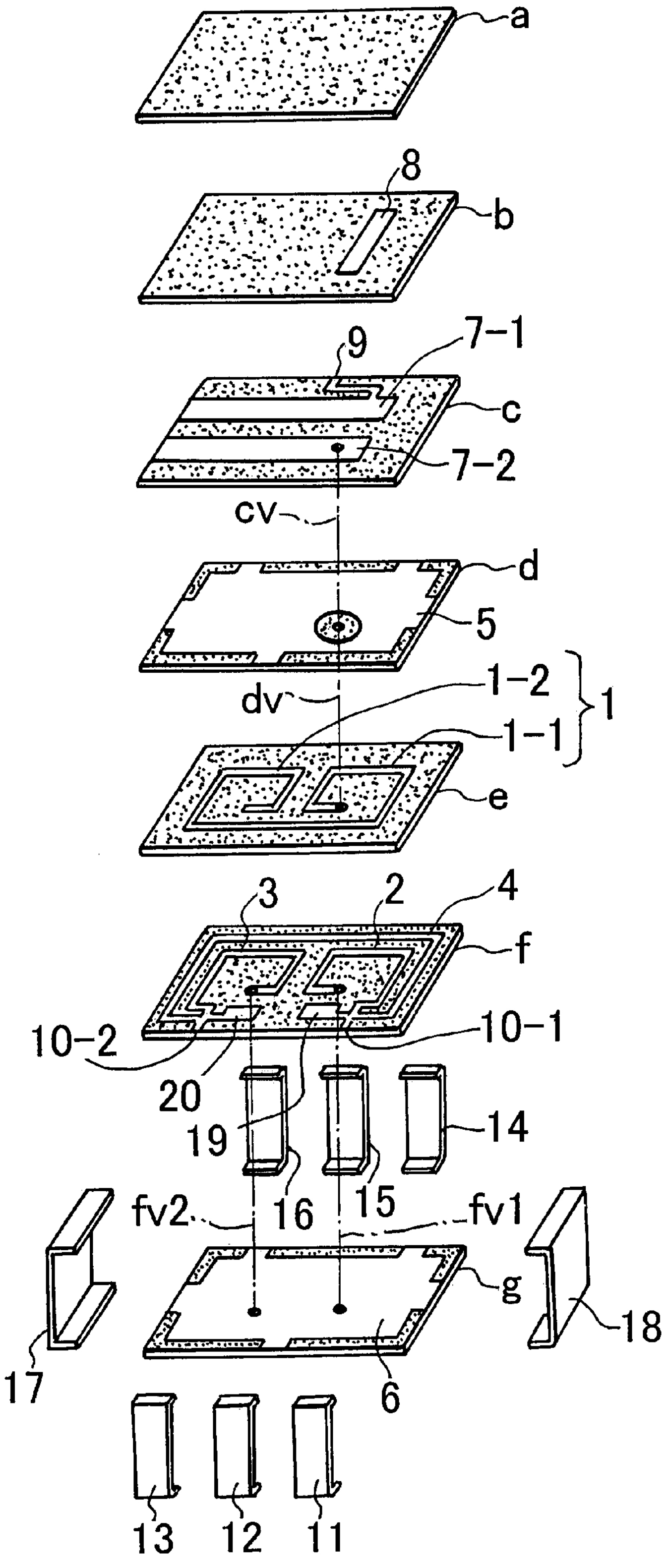
FIG. 4 is a perspective exploded view schematically showing an embodiment of the laminated balun according to the present invention.

FIG. 4 is a perspective view schematically showing another embodiment of the laminated balun according to the present invention and FIG. 5 is an equivalent circuit diagram of the laminated balun of FIG. 4.

The present embodiment differs from the embodiment described with reference to FIGS. 1 to 3 in that the matching circuit includes a capacitor in addition to the inductor realized by the conductive line 4. That is, the laminated balun according to the present embodiment further comprises a first ground capacity electrode 19 for matching circuit section which is connected to one end of the second transmission line 2 and a second ground capacity electrode 20 for matching circuit section which is connected to one end of the third transmission line 3 in addition to the components shown in FIGS. 1 to 3. The first and second ground capacity electrodes 19 and 20 are formed on the dielectric substrate f. With this configuration, first and second capacitors having capacitance components C1 and C2 are formed between the ground capacity electrodes 19, 20 and second earth electrode 6. The shape and size of the ground capacity electrodes 19 and 20 need not be the same. That is, values of the C1 and C2 need not be the same. Thus, in the case where there is any difference in characteristics between the second and third transmission lines 2 and 3, the shape and size of the ground capacity electrodes 19, 20 and therefore values of C1 and C2 can be made different from each other depending on the difference so as to further optimize the impedance matching with the external circuit.

According to the present embodiment, the matching circuit includes a capacitor in addition to the inductor. Thus, in addition to the effect obtained in the embodiment described with reference to FIGS. 1 to 3, it is possible to further optimize the impedance matching with the external circuit by appropriately setting the L, C1, and C2.

Figure 7:
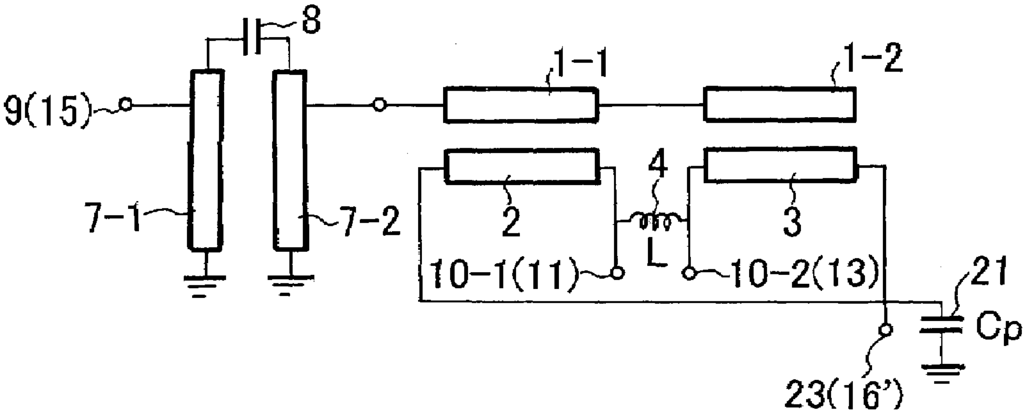
FIG. 7 is an equivalent circuit diagram of the laminated balun of FIG. 6.
Figure 6:
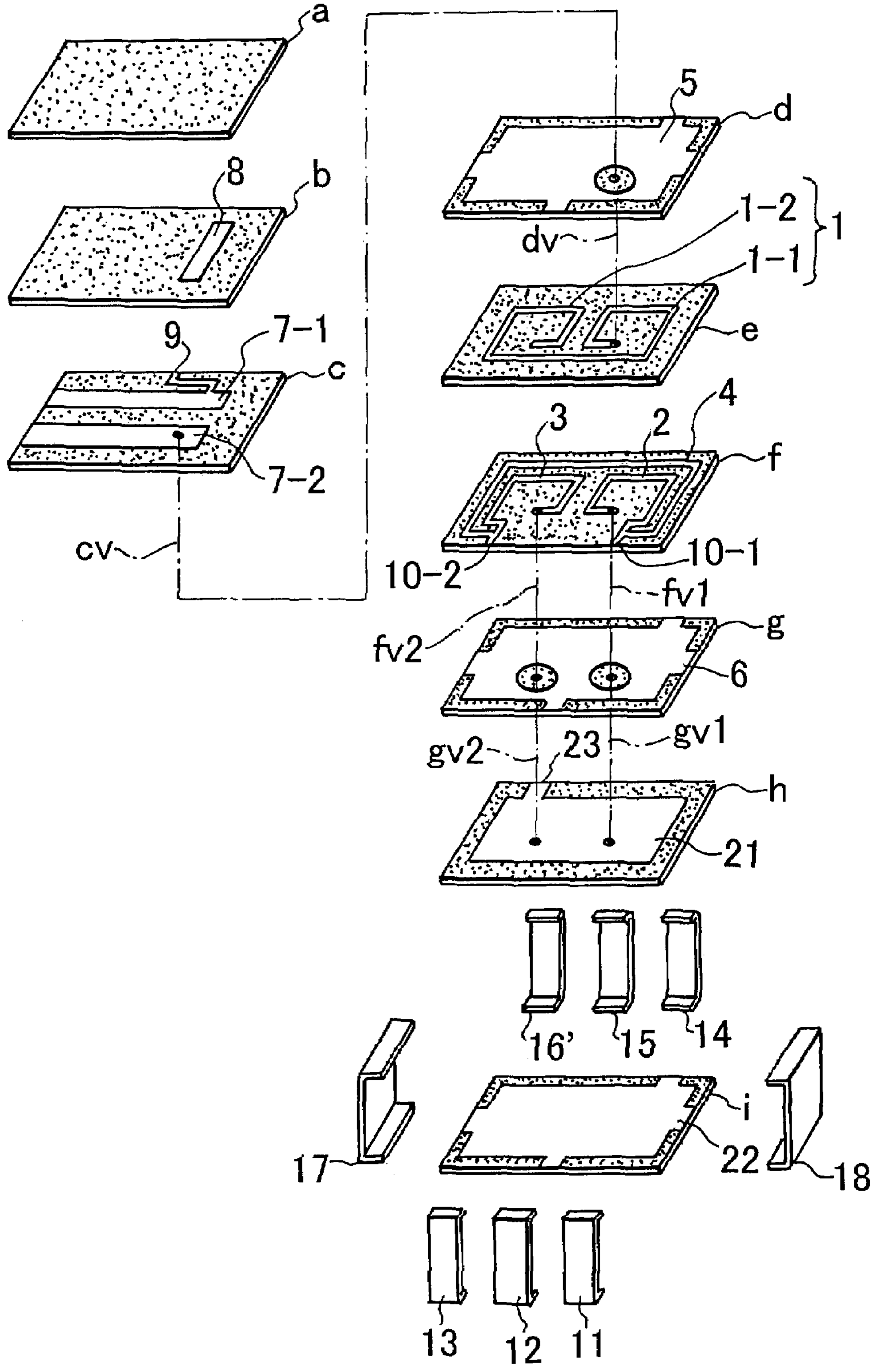
FIG. 6 is a perspective exploded view schematically showing an embodiment of the laminated balun according to the present invention.

FIG. 6 is a perspective view schematically showing another embodiment of the laminated balun according to the present invention and FIG. 7 is an equivalent circuit diagram of the laminated balun of FIG. 6.

The present embodiment differs from the embodiment described with reference to FIGS. 1 to 3 in that a DC power source connection section and a DC input terminal are additionally formed in the dielectric member X. Correspondingly, a DC input terminal 16' is employed in place of the earth terminal 16 employed in the embodiment described with reference to FIGS. 1 to 3. That is, an external DC power source is connected to the DC input terminal 16' formed on the side surface of the dielectric member X, and first and second earth electrodes 5 and 6 are connected to the earth terminals 12, 14, 17, and 18.

In the present embodiment, the dielectric member X includes, in addition to the dielectric substrates a to g, a dielectric substrate h (fifth dielectric substrate) and a dielectric substrate i. That is, the dielectric substrate h is disposed under the dielectric substrate g, and dielectric substrate i is disposed under the dielectric substrate h.

A ground capacity electrode 21 for power source connection section which is a patterned conductive film is formed on the upper main surface of the dielectric substrate h. The ground capacity electrode 21 for power source connection section is connected to the DC input terminal 16' through a drawing-out electrode 23 for power source connection. The other end of the second transmission line 2 is not connected to the earth electrode 6 but to the ground capacity electrode 21 through a via hole fv1 formed in the dielectric substrate f and via hole gv1 formed in the dielectric substrate g. The other end of the third transmission line 3 is not connected to the earth electrode 6 but to the ground capacity electrode 21 through a via hole fv2 formed in the dielectric substrate f and via hole gv2 formed in the dielectric substrate g. Opening patterns for insulation with the via holes gv1 and gv2 are formed in the earth electrode 6 on the dielectric substrate g at the position of the via holes gv1 and gv2.

A third earth electrode 22 which is a patterned conductive film is formed on the upper main surface of the dielectric substrate i. The third earth electrode 22 is connected to the earth terminals 12, 14, 17, and 18.

The capacity electrode 21 and earth electrodes 6 and 22 constitutes a capacitor having a capacitance component Cp.

Assuming that a conductive layer between the lower main surface of the dielectric substrate g and upper main surface of the dielectric substrate h is a fifth conductive layer, the present embodiment can be described as follows.

That is, in the DC power source connection section, the ground capacity electrode 21 for power source connection section is formed as a patterned conductive film constituting the fifth conductive layer and is electrically connected to the DC input terminal 16'.

According to the present embodiment, the DC power source connection section is integrated by lamination, so that the following effect can be obtained in addition to the effect obtained in the embodiment described with reference to FIGS. 1 to 3. That is, when a balanced input/output external circuit component (e.g., active component such as an amplifier) is connected to the balun through the first and second balanced input/output terminals 11 and 13, power can be supplied to the external circuit component through the DC input terminal 16', second and third transmission lines 2 and 3, and balanced input/output terminals 11 and 13. The existence of the comparatively large capacitance Cp formed by the capacity electrode 21 and earth electrodes 6, 22 achieves satisfactory noise reduction at the power supply time. This eliminates the need to separately provide a DC power source circuit component. Further, the ground capacitor for power source connection section having a capacitance Cp is incorporated in the laminated balun, thereby eliminating the need to separately provide a decoupling condenser for noise reduction at the power supply time and, also in view of this, a reduction in the number of components and area occupied by mounted components can be realized.

Figure 8:
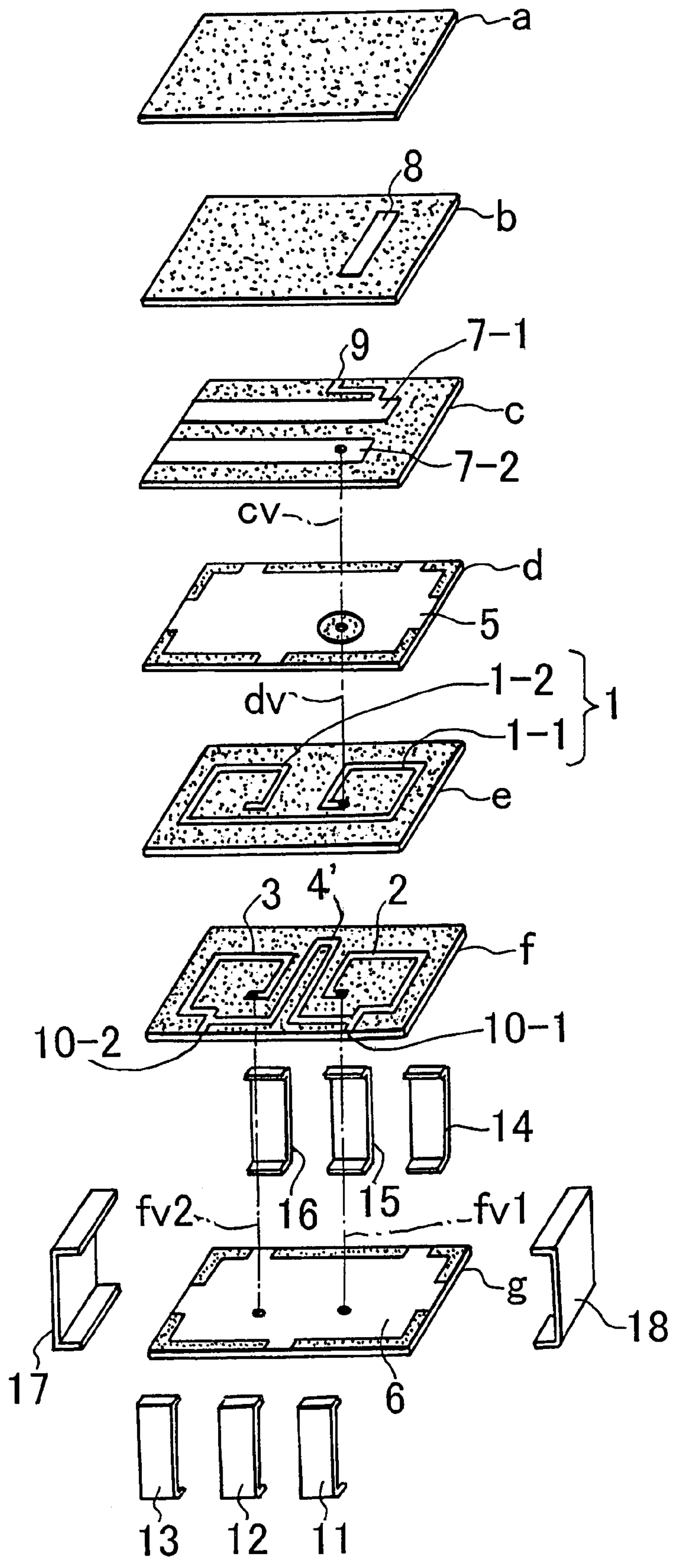
FIG. 8 is a perspective view showing an embodiment of the laminated balun according to the present invention.

FIG. 8 is a perspective view showing another embodiment of the laminated balun according to the present invention.

The present embodiment differs from the embodiment described with reference to FIGS. 1 to 3 in the pattern of the conductive lines constituting the matching circuit. That is, in the present embodiment, a conductive line 4', which extends on the upper main surface of the dielectric substrate f so as to connect the one end portion 10-1 of the second transmission line 2 to one end portion 10-2 of the third transmission line 3, has a pattern extending between the patterns of the second and third transmission lines 2 and 3. The conductive line 4' functions as an inductor having an inductance component L. The first portion 1-1 of the first transmission line is formed into a pattern corresponding to the second transmission line 2 so as to be able to form electromagnetic field coupling with the second transmission line 2. The second portion 1-2 of the first transmission line is formed into a pattern corresponding to the third transmission line 3 so as to be able to form electromagnetic field coupling with the third transmission line 3.

In the present embodiment, a distance between the second transmission line 2 and third transmission line 3 can be made larger as compared to the case of the embodiment described with reference to FIGS. 1 to 3. It is preferable that the second transmission line 2 and third transmission line 3 be not coupled to each other. Therefore, according to the present embodiment, it is possible to easily achieve more satisfactory characteristics in addition to the effect obtained in the embodiment described with reference to FIGS. 1 to 3.

As a modification of the present embodiment, a configuration in which the matching circuit includes the same capacitor as described in the embodiment of FIGS. 4 and 5 in addition to the inductor realized by the conductive line 4' may be adopted.

Although the other end of the first transmission line 1 is opened in the embodiments described above, it may be grounded through a capacitance as described in Patent Document 1. This configuration reduces the length of the first transmission line 1, contributing to further miniaturization of the laminated balun.

What is claimed is:

1. A laminated balun comprising:

a dielectric member containing a plurality of laminated dielectric substrates;

a balun section; and a matching circuit section, wherein the dielectric substrates include a first dielectric substrate, second dielectric substrate, third dielectric substrate, and fourth dielectric substrate which are sequentially arranged, the balun section has: a first earth electrode formed on a main surface of the first dielectric substrate; a second earth electrode formed on a main surface of the fourth dielectric substrate; a first transmission line which is formed on a main surface of the second dielectric substrate, one end of which is electrically connected to an unbalanced input/output terminal, and which has first and second portions; and second and third transmission lines on a main surface of the third dielectric substrate, the second transmission line being disposed so as to correspond to the first portion of the first transmission line and having one end thereof electrically connected to a first balanced input/output terminal, the third transmission line being disposed so as to correspond to the second portion of the first transmission line and having one end thereof electrically connected to a second balanced input/output terminal, and the matching circuit section is constituted by a patterned conductive film formed on the main surface of the third dielectric substrate or constituted by both a patterned conductive film formed on the main surface of the third dielectric substrate and the second earth electrode.

2. The laminated balun as claimed in claim 1, wherein the matching circuit section is constituted by the patterned conductive film formed on the main surface of the third dielectric substrate as a conductive line which extends so as to connect the one end of the second transmission line to the one end of the third transmission line, and which has an inductance component.

3. The laminated balun as claimed in claim 1, wherein the matching circuit section is constituted by: the patterned conductive film formed on the main surface of the third dielectric substrate as a conductive line, which extends so as to electrically connect the one end of the second transmission line to the one end of the third transmission line, and which has an inductance component; a first ground capacity electrode for matching circuit section which is the patterned conductive film formed on the main surface of the third dielectric substrate and which is electrically connected to the one end of the second transmission line; a second ground capacity electrode for matching circuit section which is the patterned conductive film formed on the main surface of the third dielectric substrate and which is electrically connected to the one end of the third transmission line; and the second earth electrode.

4. The laminated balun as claimed in claim 1, wherein the plurality of laminated dielectric substrates include the first dielectric substrate the second dielectric substrate, the third dielectric substrate the fourth dielectric substrate, and a fifth dielectric substrate which are sequentially arranged, the laminated balun further has a DC power source connection section formed in the dielectric member, and the DC power source connection section has a ground capacity electrode for power source connection section which is a patterned conductive film formed on a main surface of the fifth dielectric substrate, the DC power source connection section electrically connecting the ground capacity electrode for power source connection section to a DC input terminal and electrically connecting the other ends of the second and third transmission lines to the ground capacity electrode for power source connection section.

5. The laminated balun as claimed in claim 4, wherein the plurality of laminated dielectric substrates include the first dielectric substrate, the second dielectric substrate the third dielectric substrate, the fourth dielectric substrate, the fifth dielectric substrate, and a sixth dielectric substrate which are sequentially arranged, and the DC power connection section further has a third earth electrode formed on a main surface of the sixth dielectric substrate.

6. The laminated balun as claimed in claim 4, wherein the DC input terminal is attached to a side surface of the dielectric member.

7. The laminated balun as claimed in claim 1, wherein the unbalanced input/output terminal, the first balanced input/output terminal, the second balanced input/output terminal, and an earth terminal connected to the first and second earth electrodes are attached to an outer surface of the dielectric member.

8. A laminated balun comprising: a dielectric member; a plurality of conductive layers formed in the dielectric member, each of the conductive layers being a patterned conductive film; and a balun section and matching circuit section, wherein the plurality of conductive layers include a first conductive layer, second conductive layer, third conductive layer, and fourth conductive layer which are sequentially arranged, the balun section has: a first earth electrode being the patterned conductive film constituting the first conductive layer; a second earth electrode being the patterned conductive film constituting the fourth conductive layer; a first transmission line one end of which is electrically connected to an unbalanced input/output terminal and which has first and second portions and formed being the patterned conductive film constituting the second conductive layer; and second and third transmission lines being the patterned conductive film constituting the third conductive layer, the second transmission line being disposed so as to correspond to the first portion of the first transmission line and having one end thereof electrically connected to a first balanced input/output terminal, the third transmission line being disposed so as to correspond to the second portion of the first transmission line and having one end thereof electrically connected to a second balanced input/output terminal, and the matching circuit section is constituted by the patterned conductive film constituting the third conductive layer or constituted by the patterned conductive film constituting the third conductive layer and the second earth electrode.

9. The laminated balun as claimed in claim 8, wherein the matching circuit section is constituted by the patterned conductive film constituting the third conductive layer as an inductor which extends so as to connect the one end of the second transmission line to the one end of the third transmission line.

10. The laminated balun as claimed in claim 8, wherein the matching circuit section is constituted by: the patterned conductive film constituting the third conductive layer as an inductor which extends so as to connect the one end of the second transmission line to the one end of the third transmission line the second earth electrode; a first capacitor constituted by a first ground capacity electrode for matching circuit section which is the patterned conductive film constituting the third conductive layer and which is electrically connected to the one end of the second transmission line, and the second earth electrode; and a second capacitor constituted by a second ground capacity electrode for matching circuit section which is the patterned conductive film constituting the third conductive layer and which is electrically connected to the one end of the third transmission line, and the second earth electrode.

11. The laminated balun as claimed in claim 8, wherein the plurality of conductive layers include the first conductive layer, the second conductive layer, the third conductive layer, the fourth conductive layer and a fifth conductive layer which are sequentially arranged, the laminated balun further has a DC power source connection section formed in the dielectric member, and the DC power source connection section has a ground capacity electrode for power source connection section being the patterned conductive film constituting the fifth conductive layer, the DC power source connection section electrically connecting the ground capacity electrode for power source connection section to a DC input terminal and electrically connecting the other ends of the second and third transmission lines to the ground capacity electrode for power source connection section.

12. The laminated balun as claimed in claim 11, wherein the plurality of conductive layers include the first conductive layer, the second conductive layer, the third conductive layer, the fourth conductive layer, the fifth conductive layer, and a sixth conductive layer which are sequentially arranged, and the DC power source connection section further has a third earth electrode formed being the patterned conductive film constituting the sixth conductive layer.

13. The laminated balun as claimed in claim 11, wherein the DC input terminal is attached to a side surface of the dielectric member.

14. The laminated balun as claimed in claim 8, wherein the unbalanced input/output terminal, the first balanced input/output terminal, the second balanced input/output terminal, and an earth terminal connected to the first and second earth electrodes are attached to an outer surface of the dielectric member.

* * * * *